United States Patent [19]

Otaka

[11] Patent Number: 5,013,914
[45] Date of Patent: May 7, 1991

[54] METHOD AND APPARATUS FOR GENERATING ELECTRON CHANNELING PATTERNS

[75] Inventor: Tadashi Otaka, Katsuta, Japan

[73] Assignee: Hitachi, Ltd., Tokyo, Japan

[21] Appl. No.: 553,405

[22] Filed: Jul. 17, 1990

[30] Foreign Application Priority Data

Jul. 21, 1989 [JP] Japan .................... 1-187351

[51] Int. Cl.⁵ .................... H01J 37/26; G01N 23/225
[52] U.S. Cl. .................... 250/310; 250/307
[58] Field of Search ............. 250/310, 306, 307, 311

[56] References Cited

PUBLICATIONS

Schulson et al., J. Material Sci., 6, 1971, pp. 47-55.
Schulson et al., Journal of Scientific Instruments (Jrnl of Physis E) 1969, Series 2, vol. 2, pp. 247-251.
van Essen et al., Journal of Materials Science 4 (1969), pp. 336-339.

*Primary Examiner*—Jack I. Berman
*Attorney, Agent, or Firm*—Antonelli, Terry, Stout & Kraus

[57] ABSTRACT

An apparatus and a method of obtaining respective electron channeling patterns from a plurality of grains on a sample are disclosed. The sample is scanned by, for example, an electron beam two-dimensionally to specify positions of each of the grains and the positions are compared with an irradiation position of the collimated electron beam for the electron channeling pattern. The sample is moved to cause the positions of each of the grains to coincide with the irradiation position of the collimated electron beam.

18 Claims, 2 Drawing Sheets

METHOD AND APPARATUS FOR GENERATING ELECTRON CHANNELING PATTERNS

BACKGROUND OF THE INVENTION

The present invention relates to a method and an apparatus for generating electron channeling patterns, and more particularly to a method and an apparatus for generating the electron channeling patterns in the relation to a scanned image formed by electrons emitted from a sample.

A sample is scanned by a converged electron beam while a screen of a cathode-ray tube is scanned by a cathode-ray beam (electron beam) in synchronism with the scanning of the sample by the converged electron beam and the intensity modulation of the cathode-ray tube is made by secondary electrons or a reflected electron signal emitted from the sample so that a secondary electron image or a reflected electron image in a scanned area of the sample (hereinafter simply referred to as a sample scanned image) is displayed on the screen of the cathode-ray tube.

On the other hand, when a mode is changed from a display mode of the sample scanned image to an electron channeling mode, the electron beam irradiating the sample is collimated and the collimated electron beam is angularly scanned about a certain position of the sample. In other words, an incident angle and an orientation angle of the collimated beam in respect to a certain position of the sample is scanned. Thus, the secondary electrons or the reflected electrons emitted from the sample are introduced into the cathode-ray tube for the intensity modulation so that the electron channeling patterns are displayed on the screen of the cathode-ray tube instead of the sample scanned image. The electron channeling patterns are used to analyze the crystallographic orientation of crystal material (refer to "The Generation And Application Of SEM Electron Channeling Patterns" by E. M. Schulson, et al. J. Materials Sci. 6, 213-217 (1971)).

Generally, a sample scanned image is generated with a proper magnification and a desired location of the sample scanned image from which electron channeling patterns are desired to be obtained is selected. Then, the sample is moved to position the selected location to an irradiation position of the electron beam. The electron channeling pattern image generated in such a condition is recorded as a photograph or stored in a memory. When there are a plurality of locations from which the electron channeling patterns are desired to be obtained, the same steps are repeated plural times.

For example, when the crystallographic orientation of steel plate is analyzed by the electron channeling patterns to estimate the steel plate, it is necessary to obtain the electron channeling patterns for several tens to several hundreds grains confirmed through observation of the sample scanned image. In this case, the efficiency of positioning of the grains by the above-described conventional method is extremely deteriorated and accordingly it is substantially impossible to estimate exactly the sample by means of the electron channeling patterns.

SUMMARY OF THE INVENTION

It is an object of the present invention to provide a method and an apparatus for generating electron channeling patterns from a plurality of portions to be measured of a sample efficiently.

In order to achieve the above object, according to the present invention, crystal material is scanned by a charged particle beam to obtain a position of grains of which electron channeling patterns are to be obtained. The position of grains is caused to coincide with an irradiation position of an electron beam so that an electron channeling pattern signal is obtained. Thus, the positioning in respect to the grains of which the electron channeling patterns are to be obtained is effected automatically and exactly and accordingly even electron channeling pattern signals of several tens to several hundreds grains can be obtained efficiently. Thus, according to the present invention, there are provided a method and an apparatus for obtaining the electron channeling patterns suitable for exact estimation of crystal material by the electron channeling patterns.

DESCRIPTION OF THE PREFERRED EMBODIMENT

Figure 1:
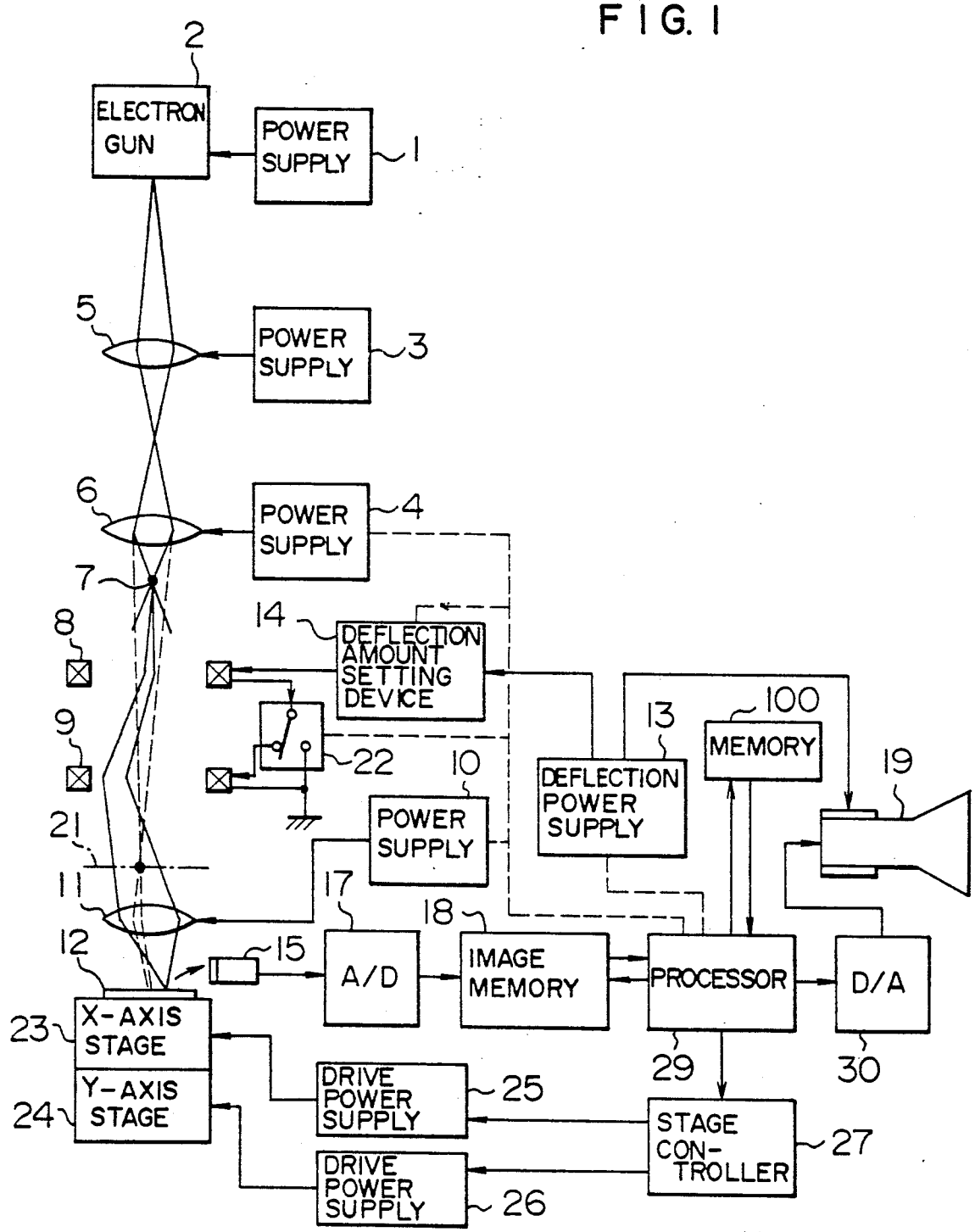
FIG. 1 is a block diagram schematically illustrating an apparatus of obtaining electron channeling patterns according to an embodiment of the present invention.

Referring to FIG. 1, an electron gun 2 is operated by a power supply 1 so that an accelerated electron beam is emitted from the electron gun 2. The electron beam is directed through focusing lenses 5 and 6 excited by power supplies 3 and 4, respectively, deflecting devices 8 and 9, and an objective lens 11 excited by a power supply 10 to a sample 12.

In a sample scanned image mode, a crossover image of the electron source is produced at a position 7 by the focusing lenses 5 and 6 and is projected on the sample 12 through the objective lens 11. Further, the deflecting devices 8 and 9 deflect the electron beam two-dimensionally while a center of a main surface of the objective lens 11 is maintained as a fulcrum so that the sample 12 is scanned by the converged electron beam two-dimensionally. A deflection signal for two-dimensionally scanning the electron beam is applied from a deflection power supply 13 through a deflection amount setting device 14 to the deflecting devices 8 and 9. The deflection power supply 13 is driven by a command from a processor 29.

The sample 12 scanned by the converged electron beam emits secondary electrons characterizing the sample and the secondary electrons are detected by a detector 15. The sample 12 also emits reflected electrons characterizing the sample and according the detector 15 may be a detector which detects the reflected electrons. An output signal from the detector 15 is converted into a digital signal by an A/D converter 17 to be stored in an image memory 18. An image signal in the memory is read out by the processor 29 and is converted into an analog signal by a D/A converter 30 to be applied to a cathode-ray tube 19 for intensity modulation. The output signal from the detector 15 may be supplied to the processor 29 directly.

The deflection signal from the deflection power supply 13 is also supplied to a deflecting device 20 of the cathode-ray tube 19 so that a screen of the cathode-ray tube 19 is two-dimensionally scanned in synchronism with the scanning of the sample 12. Accordingly, a sample scanned image is displayed on the screen of the cathode-ray tube 19 on the basis of the secondary electrons emitted from the sample 12. In this case, the deflection amount of the electron beam and hence the magnification of the sample scanned image displayed on the cathode-ray tube 19 is varied by the deflection amount setting device 14.

In an electron channeling pattern mode, the excitation condition for the focusing lens 6 and the objective lens 11 is changed. The excitation condition for the lenses can be set by applying a lens condition setting command signal from the processor 29 to the power supplies 4 and 10. Thus, the image at the crossover point of the electron source of the electron gun 2 is formed at a front focal plane of the objective lens 11. Accordingly, the objective lens 11 collimates the electron beam and the sample 12 is irradiated by the collimated beam.

Further, the deflecting device 9 is disconnected from the deflecting device 8 by a switch 22 and the deflection condition of the deflecting device 8 is changed. The switching of the switch and the change of the deflection condition of the deflecting device 8 can be made by applying a switching command signal and a deflection condition setting command signal from the processor 29 to the switch 22 and the deflection amount setting device 14, respectively. Thus, the collimated electron beam is angularly scanned in a fixed position of the sample 12. In other words, the incident angle and the orientation angle of the collimated electron beam in respect to the fixed position of the sample 12 are scanned.

Secondary electrons (which may be a reflected electron signal) emitted from the sample 12 in this state are stored in the image memory 18 in the same manner as in the sample scanned image mode. The stored image is read out by the processor 29 and is, after being subjected to D/A conversion, supplied to the cathode-ray tube 19. Accordingly, the electron channeling patterns are displayed on the cathode-ray tube 19.

The sample 12 is moved by any distance in any direction two-dimensionally by movement in X and Y directions of an X-axis stage 23 and a Y-axis stage 24. The movement in the X and Y directions of the X and Y stages 23 and 24 is made by X and Y drive power supplies 25 and 26 which are controlled by a stage controller 27 on the basis of a command from the processor 29.

Figure 2:
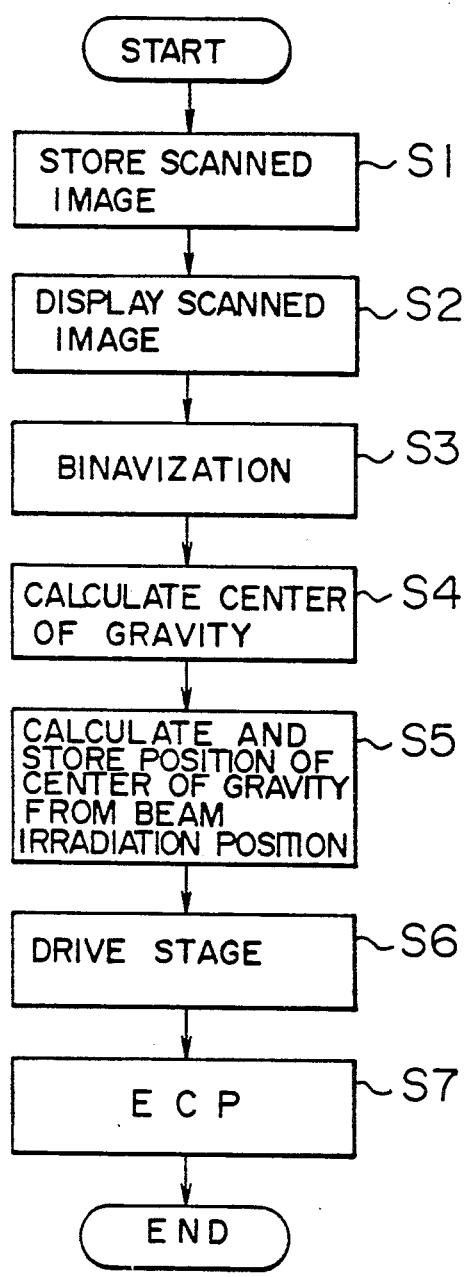
FIG. 2 is a flow chart explaining an operation of the apparatus of FIG. 1.

Referring now to a flow chart of FIG. 2, description is made to a series of operation that representative positions of grains of the sample are detected from the sample scanned image and the grains are moved to an irradiation position of the electron beam on the basis of the detected position to obtain the electron channeling patterns.

Figure 3:
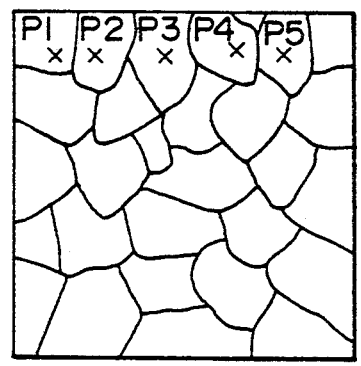
FIGS. 3 and 4 show sample scanned images obtained by the apparatus of FIG. 1.

Crystal material is used as the sample 12. The sample scanned image mode is selected and in this mode a sample scanned image signal from the sample is stored in the memory 18 (step S1). The image signal stored in the memory is read out and the sample scanned image is displayed on the cathode-ray tube 19 on the basis of the read-out image signal (step S2). An example of the sample scanned image is shown in FIG. 3, in which P1, P2, P3, . . . indicate numerous grains.

The image signal stored in the memory 18 is subjected to the binarization processing (step S3). More particularly, since there is a difference in a magnitude between an image signal from the grain boundary and an image signal from other portions than the grain boundary, a threshold level is set between an image signal level from the grain boundary and an image signal level from the other portions and the binarization processing is made for the image signal so that an image signal at the side of the image signal level from the grain boundary in respect to the threshold level is a low (L) level image signal and an image signal at the opposite side is a high (H) level image signal.

Subsequently to such a binarization processing, representative positions, typically the centers of gravity, of each of the grains are calculated (step S4). The representative positions are stored in the memory 18. In general, when positions of material particles having masses $m1, m2, \ldots$ are defined as $(x1, y1), (x2, y2), \ldots$, the positions $\bar{x}$ and $\bar{y}$ of the centers of gravity are given by $\bar{x} = \Sigma\, ximi/\Sigma\, mi$ and $\bar{y} = \Sigma\, yimi/\Sigma\, mi$. When it is assumed that each of pixels in the grain has a weight of a mass 1, mi represents 1 and $\Sigma\, mi$ represents the number of pixels in the grain, that is an area of the grain.

Then, the positions of the centers of gravity of each of the grains thus calculated are read from the memory 18 and are compared with the irradiation position of the collimated electron beam to be converted into the positions of the centers of gravity (vector value) from the irradiation position (fixed) of the electron beam in the electron channeling mode (step S5). Thus, the converted position signals of the centers of gravity are stored in the memory 18. The signals are read out from the memory 18 into the processor 29 successively and supplied to the stage controller 27 to thereby move the sample 12 automatically so that the centers of gravity of each of the grains are successively positioned to the irradiation position (fixed) of the electron beam.

The electron channeling pattern mode is selected and in this mode the electron channeling pattern signals of each of the grains are successively obtained automatically (step S7). The electron channeling pattern signals are stored in the memory 18 and supplied to the cathode-ray tube 19 to be displayed thereon.

Analysis of the electron channeling pattern and decision of the crystallographic orientation may be made by the processor 29 by using a known method on the basis of the electron channeling pattern signals stored in the memory 18. Refer to papers by S. Hara et al., the technical report of the Japan Institute of Metals, Vol. 25, No. 12, pp. 1009-, (1986), S. Hunaki et al., Iron and Steel, Vol. 70, p. 269 (1984), R. Shimizu, Iron and Steel, Vol. 70, p. 270 (1984), and K. Ohta, Iron and Steel Vol. 70, p. 271 (1984). The program for this processing is stored in a memory 100.

Figure 4:
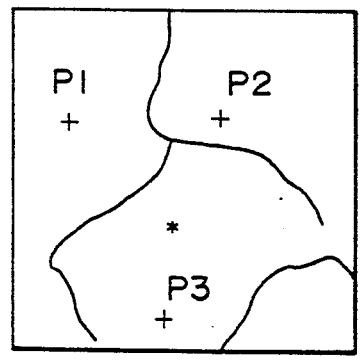

FIG. 4 shows an example of a sample scanned image in which a grain boundary is not clear. In this manner, when the grain boundary is not clear, an operator determines an analysis position (representative position) of the grains on the sample scanned image by the operator's own decision and designates it by a light pen or a moving marker. The designated position is converted into a position from the irradiation position of the electron beam in consideration of the magnification. The converted position is supplied to the stage controller 27 so that the position on the sample corresponding to the designated position is positioned to the irradiation position of the electron beam successively to thereby obtain the electron channeling pattern signal.

As apparent from the foregoing description, in the embodiment, the position of the grain of crystal material of which the electron channeling pattern is to be obtained is determined and the position of the grain is caused to coincide with the irradiation position of the electron beam so that the electron channeling pattern signal is obtained. Accordingly, even if there are very numerous grains, the electron channeling pattern signal can be obtained efficiently and hence the crystal sample can be exactly estimated by the electron channeling patterns.

As above, the present invention has been described with reference to the preferred embodiment, the present invention is not limited thereto. For example, particles used to obtain the image of the sample can use ions or light instead of electrons in the, embodiment (refer to U.S. Pat. No. 4,740,698).

I claim:

1. An apparatus for generating respective electron channeling patterns from a plurality of grains on a sample, comprising:
   means for irradiating particles onto the sample to obtain from the sample an information signal characterizing the sample and specifying representative positions of the grains on the basis of the information signal;
   means for storing said specified representative positions of the grains;
   means for comparing a predetermined position of a collimated electron beam for detecting the electron channeling patterns with said representative positions of the grains to cause said representative positions of the grains to coincide with said predetermined position of said collimated electron beam; and
   means for angularly scanning said collimated electron beam in the predetermined position thereof to obtain the electron channeling patterns from the grains which are successively positioned to said predetermined position of said collimated electron beam.

2. An apparatus for specifying electron channeling patterns according to claim 1, wherein
   said means for specifying said representative positions of the grains comprises:
   means for irradiating particles onto the sample and storing an information signal obtained from the sample and characterizing the sample; and
   means for specifying said representative positions of the grains on the basis of the stored information signal.

3. An apparatus for specifying electron channeling patterns according to claim 1, wherein
   said means for specifying said representative positions of the grains comprises:
   means for irradiating particles onto the grains and storing the information signal obtained from the sample and characterizing the sample;
   means for binarizing said stored information signal; and
   means for specifying said representative positions of the grains on the basis of the binarized information signal.

4. An apparatus for specifying electron channeling patterns according to claim 1, wherein
   said comparing means comprises:
   sample holding means capable of moving on a plane which is substantially orthogonal to an axis of the collimated electron beam for the electron channeling; and
   means for moving a stage to cause the predetermined position of the collimated electron beam to coincide with the representative positions of the grains successively.

5. An apparatus for specifying electron channeling patterns according to claim 1, wherein stop of irradiation of the particles for specifying the representative positions of the grains is synchronized with start of the angular scanning of the collimated electron beam.

6. An apparatus for specifying electron channeling patterns according to claim 1, wherein
   the irradiation particles for specifying the representative positions of the grains are selected from a group consisting of electrons, ions and light.

7. An apparatus for specifying electron channeling patterns according to claim 1, wherein
   the particles for specifying the representative, positions of the grains are irradiated onto the sample in the form of beam and are scanned on the sample two-dimensionally.

8. An apparatus for specifying electron channeling patterns according to claim 1, wherein
   the representative positions of the grains are the centers of gravity.

9. An apparatus for specifying electron channeling patterns according to claim 1, further comprising
   means for storing the electron channeling pattern signal.

10. An apparatus for specifying electron channeling patterns according to claim 1, further comprising
    means for forming an image on the basis of the information signal characterizing the sample.

11. An apparatus for specifying crystallographic orientation of a plurality of grains on a sample, comprising:
    means for irradiating particles onto the sample to obtain from the sample an information signal characterizing the sample and specifying representative positions of the grains on the basis of the information signal;
    means for storing said specified representative positions of the grains;
    means for comparing a predetermined position of a collimated electron beam for detecting the electron channeling patterns with said representative positions of the grains to cause said representative positions of the grains to coincide with said predetermined position of said collimated electron beam;
    means for angularly scanning said collimated electron beam in the predetermined position thereof to obtain the electron channeling patterns from the grains which are successively positioned to said predetermined position of said collimated electron beam; and
    means for specifying the crystallographic orientation of the grains from the electron channeling pattern signal.

12. An apparatus for specifying crystallographic orientation of a plurality of grains on a sample according to claim 11, further comprising
    means for storing the electron channeling pattern signal.

13. A method of obtaining respective electron channeling patterns of a plurality of grains on a sample, comprising:
    a step of irradiating particles onto the sample to obtain from the sample an information signal characterizing the sample and specifying representative positions of the grains on the basis of the information signal;

a step of storing said specified representative positions of the grains;

a step of comparing a predetermined position of a collimated electron beam for detecting the electron channeling patterns with said representative positions of the grains to cause said representative positions of the grains to coincide with said predetermined position of said collimated electron beam;

a step of angularly scanning said collimated electron beam in the predetermined position thereof to obtain the electron channeling patterns from the grains which are successively positioned to said predetermined position of said collimated electron beam.

14. A method of specifying electron channeling patterns according to claim 13, wherein the step of specifying said representative positions of the grains comprises:

a step of irradiating particles onto the sample and storing an information signal obtained from the sample and characterizing the sample; and a step of specifying said representative positions of the grains on the basis of the stored information signal.

15. A method of specifying electron channeling patterns according to claim 13, wherein the step of specifying said representative positions of the grains comprises:

a step of irradiating particles onto the grains to storing the information signal obtained from the sample and characterizing the sample;

a step of binarizing said stored information signal; and a step specifying said representative positions of the grains on the basis of the binarized information signal.

16. A method of specifying electron channeling patterns according to claim 13, further comprising a step of storing the electron channeling pattern signal.

17. A method of specifying electron channeling patterns according to claim 13, wherein the step of irradiation of the particles for specifying the representative positions of the grains is synchronized with start of the angular scanning of the collimated electron beam.

18. A method of specifying crystallographic orientation of a plurality of grains on a sample, comprising:

a step of irradiating particles onto the sample to obtain from the sample an information signal characterizing the sample and specifying representative positions of the grains on the basis of the information signal;

a step of storing said specified representative positions of the grains;

a step of comparing a predetermined position of a collimated electron beam for detecting the electron channeling patterns with said representative positions of the grains to cause said representative positions of the grains to coincide with said predetermined position of said collimated electron beam;

a step of angularly scanning said collimated electron beam in the predetermined position thereof to obtain the electron channeling patterns from the grains which are successively positioned to said predetermined position of said collimated electron beam; and a step of specifying the crystallographic orientation of the grains from the electron channeling pattern signal.

* * * * *